(12) United States Patent
Meng

(10) Patent No.: US 11,545,610 B2
(45) Date of Patent: Jan. 3, 2023

(54) PIEZOELECTRIC SENSOR, PRESSURE DETECTING DEVICE, MANUFACTURING METHODS AND DETECTION METHOD

(71) Applicant: BOE TECHNOLOGY GROUP CO., LTD., Beijing (CN)

(72) Inventor: Hu Meng, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 1165 days.

(21) Appl. No.: 15/922,016

(22) Filed: Mar. 15, 2018

(65) Prior Publication Data

US 2019/0058106 A1 Feb. 21, 2019

(30) Foreign Application Priority Data

Aug. 17, 2017 (CN) .......................... 201710706179.6

(51) Int. Cl.

| | |
|---|---|
| H01L 41/113 | (2006.01) |
| G01L 1/16 | (2006.01) |
| H01L 41/27 | (2013.01) |
| H01L 41/047 | (2006.01) |
| H01L 41/193 | (2006.01) |
| H01L 27/12 | (2006.01) |
| H01L 29/786 | (2006.01) |
| H01L 29/24 | (2006.01) |
| G01L 1/22 | (2006.01) |

(Continued)

(52) U.S. Cl.
CPC ............ *H01L 41/1132* (2013.01); *G01L 1/16* (2013.01); *G01L 1/2293* (2013.01); *H01L 27/1248* (2013.01); *H01L 29/24* (2013.01); *H01L 29/66742* (2013.01); *H01L 29/78654* (2013.01); *H01L 29/78681* (2013.01); *H01L 29/78696* (2013.01); *H01L 29/84* (2013.01); *H01L 41/0471* (2013.01); *H01L 41/193* (2013.01); *H01L 41/27* (2013.01); *H01L 29/0673* (2013.01)

(58) Field of Classification Search
CPC . H01L 41/1132; H01L 41/0471; H01L 41/193
See application file for complete search history.

(56) References Cited

U.S. PATENT DOCUMENTS

| | | | |
|---|---|---|---|
| 10,269,837 B2 | 4/2019 | Lin | |
| 2005/0181587 A1* | 8/2005 | Duan | ..................... H01F 1/405 |
| | | | 438/551 |

(Continued)

FOREIGN PATENT DOCUMENTS

| | | |
|---|---|---|
| CN | 104655000 A | 5/2015 |
| CN | 105070823 A | 11/2015 |

(Continued)

OTHER PUBLICATIONS

First Office Action, including Search Report, for Chinese Patent Application No. 201710706179.6, dated Mar. 7, 2019, 22 pages.

*Primary Examiner* — Bryan P Gordon
(74) *Attorney, Agent, or Firm* — Westman, Champlin & Koehler, P.A.

(57) ABSTRACT

The present disclosure provides a piezoelectric sensor, a pressure detecting device, their manufacturing methods and a detection method. The piezoelectric sensor comprises a thin film transistor located on a substrate and comprising an active layer, and a piezoelectric layer that is in contact with the active layer of the thin film transistor.

20 Claims, 4 Drawing Sheets

(51) Int. Cl.
*H01L 29/84* (2006.01)
*H01L 29/66* (2006.01)
H01L 29/06 (2006.01)

(56) References Cited

U.S. PATENT DOCUMENTS

| | | | |
|---|---|---|---|
| 2009/0127977 A1* | 5/2009 | So | H01L 27/20 310/322 |
| 2014/0191221 A1 | 7/2014 | Benwadih et al. | |
| 2018/0099414 A1* | 4/2018 | Chuang | H01L 41/1132 |
| 2018/0122841 A1* | 5/2018 | Lin | H01L 31/0224 |
| 2018/0195921 A1* | 7/2018 | Al Ahmad | G01L 9/0042 |
| 2018/0286989 A1 | 10/2018 | Zhang et al. | |

FOREIGN PATENT DOCUMENTS

| | | |
|---|---|---|
| CN | 105203019 A | 12/2015 |
| CN | 105789324 A | 7/2016 |
| CN | 106328716 A | 1/2017 |
| JP | 2005249644 A | 9/2005 |

* cited by examiner

PIEZOELECTRIC SENSOR, PRESSURE DETECTING DEVICE, MANUFACTURING METHODS AND DETECTION METHOD

CROSS-REFERENCE TO RELATED APPLICATION

This application claims a priority to Chinese Patent Application No. 201710706179.6 filed on Aug. 17, 2017, the disclosures of which are incorporated in their entirety by reference herein.

TECHNICAL FIELD

The present disclosure relates to the field of piezoelectric sensor technology, in particular to a piezoelectric sensor, a pressure detecting device, their manufacturing methods and a detection method.

BACKGROUND

Piezoelectric sensors are a type of devices that use piezoelectric effect. The so-called piezoelectric effect refers to a phenomenon in which, when some dielectrics are deformed under an action of an external force applied in a certain direction, internal polarization will occur therein and opposite positive and negative charges appear on their two opposite surfaces simultaneously. The phenomenon in which the dielectrics will return to their uncharged state when the external force is removed and the polarity of the charges will also vary when the direction of the force is changed, is known as positive piezoelectric effect. Conversely, the phenomenon in which the dielectrics will be also deformed when an electric field is applied in the direction of polarization of the dielectrics and the deformation of the dielectrics will disappear when the electric field is removed, is known as inverse piezoelectric effect.

The existing piezoelectric sensor includes a first electrode layer, a second electrode layer and a piezoelectric layer located therebetween. When opposite positive and negative charges are generated on the piezoelectric layer, there will be a current flowing between the first electrode layer and the second electrode layer.

In recent years, with intensive development of the internet of things, flexible electronics related to human body pressure sensing, such as electronic skin, are beginning to receive widespread attention. These electronics often need to be provided with piezoelectric sensors in the form of an array, but it is difficult for the structure of the above-mentioned existing piezoelectric sensors to support integrated and highly-sensitive array control.

SUMMARY

An object of the present disclosure is to provide a solution that can be suitable for integrated and highly-sensitive piezoelectric sensors arranged in the form of an array.

In one aspect of the present disclosure, a piezoelectric sensor is provided, which comprises:
a substrate;
a thin film transistor located on the substrate and comprising an active layer; and
a piezoelectric layer that is in contact with the active layer of the thin film transistor.

Optionally, the piezoelectric layer is in contact with at least a channel region of the active layer between a source electrode and a drain electrode of the thin film transistor.

Optionally, at least the side of the active layer, which is in contact with the piezoelectric layer, is formed from a semiconductor nanomaterial.

Optionally, the active layer is formed from a semiconductor nanomaterial.

Optionally, the semiconductor nanomaterial comprises at least one of $MoS_2$, semiconducting carbon nanotubes, silicon nanowires and group III-V nanowires.

Optionally, the material for forming the piezoelectric layer comprises polyvinylidene fluoride (PVDF).

Optionally, the substrate is a flexible substrate.

In another aspect of the present disclosure, a method for manufacturing a piezoelectric sensor is provided, which method comprises:
providing a substrate;
preparing, on the substrate, a thin film transistor comprising an active layer; and
forming a piezoelectric layer that is in contact with the active layer of the thin film transistor.

Optionally, the step of preparing a thin film transistor on the substrate comprises:
forming a gate metal layer on the substrate and performing a patterning process on the gate metal layer so as to form a gate electrode of the thin film transistor;
forming a gate insulating layer;
forming a semiconductor nanomaterial layer on the gate insulating layer and performing a patterning process on the semiconductor nanomaterial layer so as to form at least a part of the active layer of the thin film transistor; and
forming a source-drain metal layer on the active layer and performing a patterning process on the source-drain metal layer so as to form a source-drain electrode layer comprising a source electrode and a drain electrode, and
the step of forming a piezoelectric layer that is in contact with the active layer of the thin film transistor comprises:
applying a PVDF solution to the source-drain electrode layer to form, after annealing treatment, a PVDF polymer film that is in contact with the active layer and serves as the piezoelectric layer.

Optionally, the step of preparing a thin film transistor on the substrate and forming a piezoelectric layer that is in contact with the active layer of the thin film transistor comprises:
forming a semiconductor nanomaterial layer on the substrate and performing a patterning process on the semiconductor nanomaterial layer so as to form at least a part of the active layer of the thin film transistor;
forming a source-drain metal layer on the active layer and performing a patterning process on the source-drain metal layer so as to form a source-drain electrode layer comprising a source electrode and a drain electrode;
applying a PVDF solution to the source-drain electrode layer to form, after annealing treatment, a PVDF polymer film that is in contact with the active layer and serves as the piezoelectric layer;
forming a gate insulating layer on the piezoelectric layer; and
forming a gate metal layer on the gate insulating layer and performing a patterning process on the gate metal layer so as to form a gate electrode of the thin film transistor.

In a still another aspect of the present disclosure, a pressure detecting device is provided, which device comprises:
a plurality of piezoelectric sensors as described above, arranged in the form of an array;
a plurality of first signal lines each connected to a gate electrode of at least one of the piezoelectric sensors;

a plurality of second signal lines each connected to a source electrode of at least one of the piezoelectric sensors;

a plurality of third signal lines each connected to a drain electrode of at least one of the piezoelectric sensors; and a controller configured to load a signal to the plurality of first signal lines and the plurality of second signal lines and to receive a signal from the plurality of third signal lines.

In a further aspect of the present disclosure, a method for manufacturing a pressure detecting device is provided, which method comprises:

fabricating on a substrate a plurality of piezoelectric sensors as described above, arranged in the form of an array;

forming a plurality of first signal lines each connected to a gate electrode of at least one of the piezoelectric sensors;

forming a plurality of second signal lines each connected to a source electrode of at least one of the piezoelectric sensors; and forming a plurality of third signal lines each connected to a drain electrode of at least one of the piezoelectric sensors.

Optionally, the step of fabricating on a substrate a plurality of piezoelectric sensors as described above arranged in the form of an array comprises:

forming a gate metal layer on the substrate and performing a patterning process on the gate metal layer so as to form the gate electrode of the thin film transistor;

forming a gate insulating layer;

forming a semiconductor nanomaterial layer on the gate insulating layer and performing a patterning process on the semiconductor nanomaterial layer so as to form at least a part of the active layer of the thin film transistor;

forming a source-drain metal layer on the active layer and performing a patterning process on the source-drain metal layer so as to form a source-drain electrode layer comprising the source electrode and the drain electrode;

applying a PVDF solution to the source-drain electrode layer to form, after annealing treatment, a PVDF polymer film that is in contact with the active layer and serves as the piezoelectric layer; and forming a first via hole for exposing the gate electrode, a second via hole for exposing the source electrode and a third via hole for exposing the drain electrode in the PVDF polymer film by a patterning process, and the step of forming a plurality of first signal lines, a plurality of second signal lines and a plurality of third signal lines comprises:

depositing a conductive material by a sputtering process to form a first signal line, a second signal line and a third signal line, wherein the first signal line is connected to the gate electrode through the first via hole, the second signal line is connected to the source electrode through the second via hole, and the third signal line is connected to the drain electrode through the third via hole.

Optionally, the step of fabricating on a substrate a plurality of piezoelectric sensors as described above, arranged in the form of an array comprises:

forming a semiconductor nanomaterial layer on the substrate and performing a patterning process on the semiconductor nanomaterial layer so as to form at least a part of the active layer of the thin film transistor;

forming a source-drain metal layer on the active layer and performing a patterning process on the source-drain metal layer so as to form a source-drain electrode layer comprising the source electrode and the drain electrode;

applying a PVDF solution to the source-drain electrode layer to form, after annealing treatment, a PVDF polymer film that is in contact with the active layer and serves as the piezoelectric layer;

forming a fourth via hole for exposing the source electrode and a fifth via hole for exposing the drain electrode in the PVDF polymer film by a patterning process;

forming a gate insulating layer on the piezoelectric layer;

forming a sixth via hole for exposing the source electrode and a seventh via hole for exposing the drain electrode in the gate insulating layer by a patterning process, the sixth via hole and the fourth via hole forming an eighth via hole for exposing the source electrode, the fifth via hole and the seventh via hole forming a ninth via hole for exposing the drain electrode; and forming a gate metal layer on the gate insulating layer and performing a patterning process on the gate metal layer so as to form the gate electrode of the thin film transistor, and the step of forming a plurality of first signal lines, a plurality of second signal lines and a plurality of third signal lines comprises:

depositing a conductive material by a sputtering process to form a first signal line, a second signal line and a third signal line, wherein the first signal line is connected to the gate electrode, the second signal line is connected to the source electrode through the eighth via hole, and the third signal line is connected to the drain electrode through the ninth via hole.

In a still another aspect of the present disclosure, a detection method is provided which is applied to the pressure detecting device as described above, which method comprises:

loading a first signal to the first signal line so as to enable the source electrode and the drain electrode of the piezoelectric sensor corresponding to the first signal line to be electrically connected to each other;

loading a second signal to the second signal line so that the second signal flows from the source electrode of the piezoelectric sensor corresponding to the second signal line to the third signal line connected to the drain electrode of the piezoelectric sensor to form a third signal;

receiving the third signal outputted by the third signal line; and comparing the second signal and the third signal of the same piezoelectric sensor to determine a source-drain current of the piezoelectric sensor, and determining that a change in pressure has been detected at a position of the piezoelectric sensor in the case that the source-drain current is greater than or equal to a preset threshold.

DETAILED DESCRIPTION

In order to make the objects, technical solutions and advantages of the present disclosure more apparent, the present disclosure will be described hereinafter in a clear and complete manner in conjunction with the drawings and specific embodiments.

In view of the problem existing in the existing piezoelectric sensors that it is difficult for their structures to achieve an array layout, the present disclosure provides technical solutions as follows.

Figure 1:
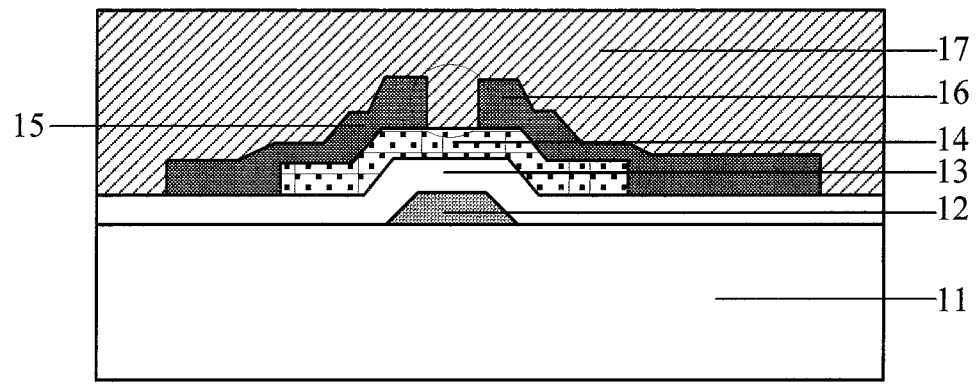
FIG. 1 is a structural schematic view of a piezoelectric sensor provided in an embodiment of the present disclosure.

In one aspect, an embodiment of the present disclosure provides a piezoelectric sensor. As shown in FIG. 1, the piezoelectric sensor comprises: a thin film transistor (TFT) located on a substrate 11, which, for example in the form of a bottom gate structure, comprises a gate electrode 12, a gate insulating layer 13, an active layer 14, a source electrode 15 and a drain electrode 16; and a piezoelectric layer 17 that is in contact with the active layer 14 of the thin film transistor.

When an external force is applied to the piezoelectric sensor, the substrate bends, resulting in the positive piezoelectric effect in the piezoelectric layer, i.e., generating positive or negative bound charges on upper and lower surfaces of the piezoelectric layer. Under the action of the electric field of the bound charges on the lower surface, the energy band of the active layer is bent to cause a change in a carrier concentration of the TFT channel, thereby leading to a change in a source-drain current of the TFT. If the change in the source-drain current is scanned, it can be regarded as detecting a corresponding pressure signal. The piezoelectric sensor according to this embodiment is based on the structure of a thin film transistor, and it is thus possible to achieve the control of the piezoelectric sensor through the control of turning on or off of the thin film transistor. The piezoelectric sensor according to this embodiment can be applied to some electronics that require piezoelectric sensors to be distributed in the form of an array.

In one embodiment of the present disclosure, the piezoelectric layer 17 is in contact with at least a channel region (at the dotted line of FIG. 1) of the active layer 14 between the source electrode 15 and the drain electrode 16 of the thin film transistor. This contact causes the piezoelectric layer 17 to affect a carrier concentration of the active layer 14 in the channel region, thus making it possible to effectively affect the source-drain current.

In one embodiment of the present disclosure, the substrate 11 may be a flexible substrate. The flexible substrate can meet the requirements of service life and the like, and also can be applied to wearable devices, electronic skin and other applications.

In one embodiment of the present disclosure, the thin film transistor may be a top gate structure.

In one embodiment of the present disclosure, at least the side of the active layer 14, which is in contact with the piezoelectric layer 17, is formed from a semiconductor nanomaterial.

In one embodiment of the present disclosure, the piezoelectric layer 17 is made of polyvinylidene fluoride (PVDF) with abrasion resistance and flexibility.

In one embodiment of the present disclosure, the active layer 14 is formed from a semiconductor nanomaterial. After the semiconductor nanomaterial is in contact with the piezoelectric layer 17, a weak signal generated by strain can be obtained more sensitively.

In one embodiment of the present disclosure, the semiconductor nanomaterial may comprise at least one of semiconducting carbon nanotubes, silicon nanowires and group III-V nanowires for manufacturing one-dimensional semiconductor thin film, and $MoS_2$ for manufacturing a two-dimensional semiconductor thin film.

In one embodiment of the present disclosure, the group III-V nanowires refer to those made of group III-V materials, such as $In_xGa_{1-x}$ As (0≤x≤1), GaP, GaN or InP nanowires. For example, the group III-V nanowires may be formed on a silicon substrate by epitaxial growth technology.

After the active layer of the present embodiment is prepared using the above-mentioned semiconductor nanomaterial, it can be ensured that the piezoelectric sensor has a higher signal-to-noise ratio. Therefore, after the piezoelectric layer receives a pressure, a slight difference between signals can be displayed, and it is not necessary to provide an additional signal amplification circuit at an output terminal of the piezoelectric sensor. Therefore, the piezoelectric sensor according to the present embodiment is simple in the implementation of the circuit and has high practicality.

Figure 2:
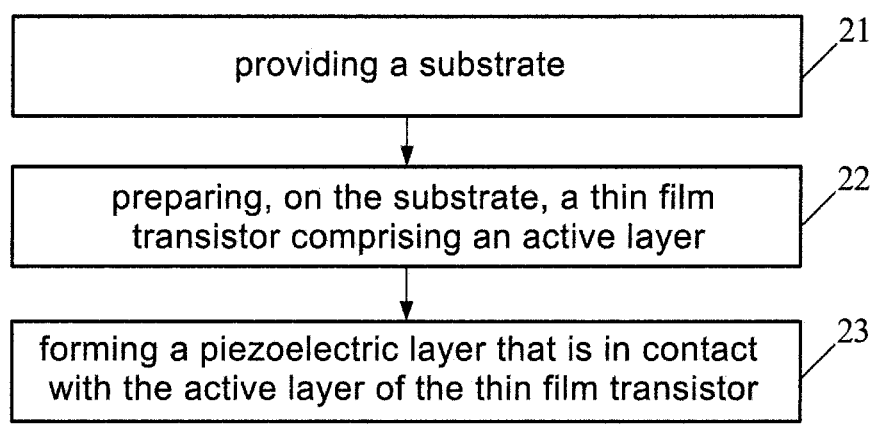
FIG. 2 is a schematic flow chart of a method for manufacturing the piezoelectric sensor provided in an embodiment.

In another aspect, an embodiment of the present disclosure further provides a method for manufacturing a piezoelectric sensor. As shown in FIG. 2, the method comprises the following steps:

step 21: providing a substrate;

step 22: preparing, on the substrate, a thin film transistor comprising an active layer; and step 23: forming a piezoelectric layer that is in contact with the active layer of the thin film transistor.

Obviously, the method of this embodiment is used for manufacturing the piezoelectric sensor as provided above in the present disclosure. Therefore, the technical effects that can be achieved by the piezoelectric sensor can be also achieved by the method of this embodiment.

The method of this embodiment will be described below in detail with reference to specific embodiments.

In some embodiments, take a case where the piezoelectric sensor comprises a bottom gate thin film transistor and the substrate is a flexible substrate for example. The method for preparing the piezoelectric sensor comprises the following steps.

In step A1, a gate metal layer was formed on the flexible substrate which had been cleaned, and a patterning process was performed on the gate metal layer so as to form a gate electrode of the thin film transistor.

Specifically, a sputtering or thermal evaporation method may be used to deposit the gate metal layer having a thickness of about 220 nm on the flexible substrate. The gate metal layer may be made of a metal, such as Cu, Al, Ag, Mo, Cr, Nd, Ni, Mn, Ti, Ta and W, or an alloy thereof. The gate metal layer may be a single-layered structure or a multi-layered structure that comprises, for example, Cu\Mo, Ti\Cu\Ti, Mo\Al\Mo, etc. A layer of photoresist was coated onto the gate metal layer, and then exposed using a mask plate such that the photoresist formed a photoresist unreserved region and a photoresist reserved region. The photoresist reserved region corresponds to a region where a pattern of the gate electrode is located, and the photoresist unreserved region corresponds to a region other than the pattern. After a developing treatment, the photoresist in the photoresist unreserved region was completely removed and the photoresist in the photoresist reserved region remained unchanged in its thickness. The gate metal film in the photoresist unreserved region was completely etched off through a wet etching process, and the remaining photoresist was peeled off to form the pattern of the gate electrode.

In step A2, a gate insulating layer was formed.

Specifically, a plasma enhanced chemical vapor deposition (PECVD) method may be used to deposit a gate insulating layer having a thickness of from 100 nm to 200 nm on the flexible substrate on which the step A1 had been carried out. The gate insulating layer may be made of oxides, nitrides or nitrogen oxides, and corresponding reaction gas may be $SiH_4$, $NH_3$, $N_2$ or $SiH_2Cl_2$, $NH_3$, $N_2$.

In step A3, a semiconductor nanomaterial layer was formed on the gate insulating layer, and a patterning process was performed on the semiconductor nanomaterial layer so as to form at least a part of the active layer of the thin film transistor.

Forming at least a part of the active layer of the thin film transistor may mean that the entire active layer is formed from the semiconductor nanomaterial or that the side of the active layer facing the piezoelectric layer is formed from the semiconductor nanomaterial.

Specifically, after applying the semiconductor nanomaterial to the surface of the gate insulating layer through a solution process such as spin-applying, dip-applying, etc., a pattern of the semiconductor nanomaterial was defined by photoetching. After development, oxygen reactive ion etching was performed using a photoresist mask to remove the semiconductor nanomaterial surrounding the mask, so as to form a pattern of the semiconductor nanomaterial layer. The pattern of the etched semiconductor nanomaterial layer is in contact with at least the channel region of the active layer.

In step A4, a source-drain metal layer was formed on the active layer, and a patterning process was performed on the source-drain metal layer to form a source-drain electrode layer comprising a source electrode and a drain electrode.

Specifically, magnetron sputtering, thermal evaporation or other film-forming methods may be used to deposit a source-drain metal layer having a thickness in the range of about 190 nm to 210 nm, which is preferably 200 nm, on the flexible substrate where the step A3 had been carried out. The source-drain metal layer may be made of a metal such as Cu, Al, Ag, Mo, Cr, Nd, Ni, Mn, Ti, Ta and W, or an alloy thereof. The source-drain metal layer may be a single layered structure or a multi-layered structure that comprises, for example, Cu\Mo, Ti\Cu\Ti, Mo\Al\Mo, etc. A layer of photoresist was coated onto the source-drain metal layer, and then exposed using a mask plate such that the photoresist formed a photoresist unreserved region and a photoresist reserved region. The photoresist reserved region corresponds to a region where patterns of the source and drain electrodes are located, and the photoresist unreserved region corresponds to a region other than the patterns. After a developing treatment, the photoresist in the photoresist unreserved region was completely removed and the photoresist in the photoresist reserved region remained unchanged in its thickness. The source-drain metal layer in the photoresist unreserved region was completely etched off through an etching process, and the remaining photoresist was peeled off to form the source-drain electrode layer comprising the drain and source electrodes.

In step A5, a PVDF solution was applied to the source-drain electrode layer to form, after annealing treatment, a PVDF polymer film that is in contact with the active layer and serves as the piezoelectric layer.

In some embodiments, take a case where the piezoelectric sensor comprises a top gate thin film transistor for example. The method for preparing this piezoelectric sensor comprises the following steps.

In step A1', a semiconductor nanomaterial layer was formed on a substrate, and a patterning process was performed on the semiconductor nanomaterial layer so as to form at least a part of the active layer of the thin film transistor.

In step A2', a source-drain metal layer was formed on the active layer, and a patterning process was performed on the source-drain metal layer to form a source-drain electrode layer comprising a source electrode and a drain electrode.

In step A3', a PVDF solution was applied to the source-drain electrode layer to form, after annealing treatment, a PVDF polymer film that is in contact with the active layer and serves as the piezoelectric layer.

In step A4', a gate insulating layer was formed on the piezoelectric layer.

In step A5', a gate metal layer was formed on the gate insulating layer, and a patterning process was performed on the gate metal layer so as to form a gate electrode of the thin film transistor.

In the manufacturing process, for the specific process of each of the steps, reference may be made to the some embodiments above, and those processes will not be repeated here.

The above some embodiments are merely used for the exemplary description of the method for manufacturing the piezoelectric sensor of the present disclosure. The thin film transistor of the manufactured piezoelectric sensor may be a top gate structure or a bottom gate structure, but it is not intended to limit the scope of the disclosure thereto.

Figure 3:
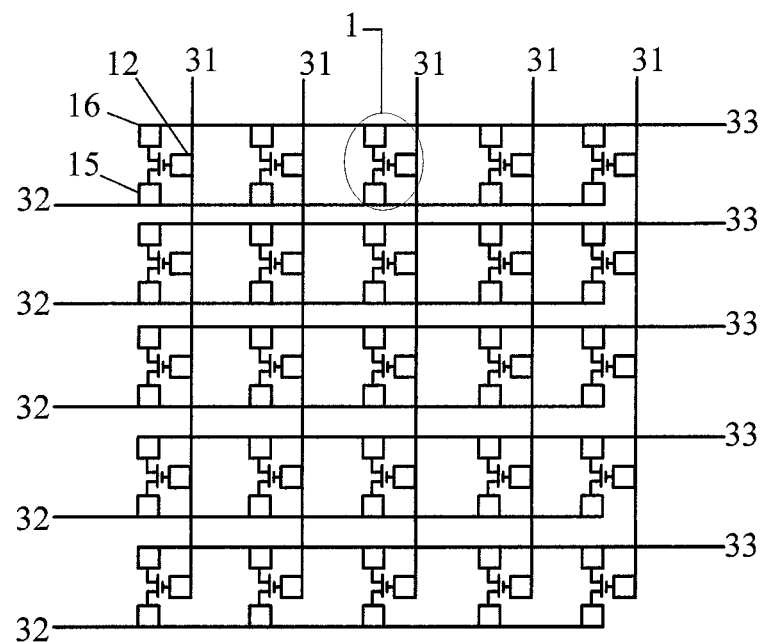
FIGS. 3 and 4 are structural schematic views of a pressure detecting device provided in an embodiment of the present disclosure.
Figure 4:
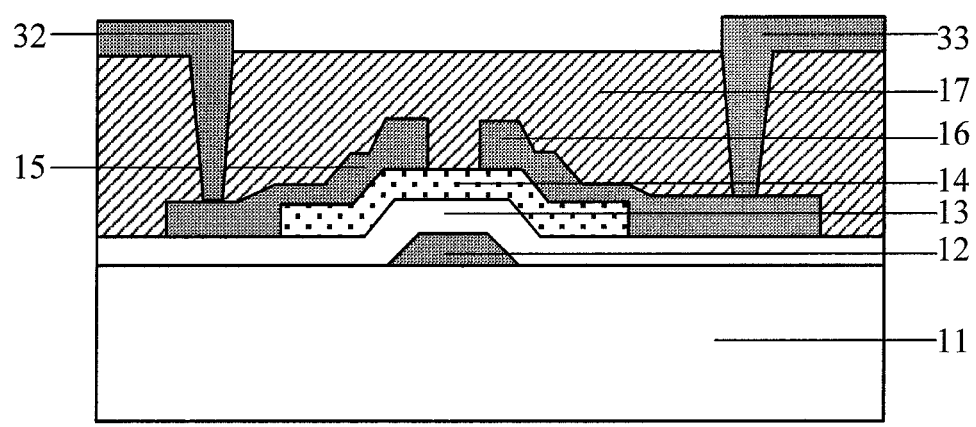

In another aspect, another embodiment of the present disclosure further provides a pressure detecting device. As shown in FIGS. 3 and 4, the pressure detecting device comprises:

a plurality of piezoelectric sensors 1 as described above arranged in the form of an array, each comprising a gate electrode 12, a source electrode 15 and a drain electrode 16 (each of which is shown in a square block for the convenience of viewing);

a plurality of first signal lines 31 each connected to the gate electrode 12 of at least one of the piezoelectric sensors 1;

a plurality of second signal lines 32 each connected to the source electrode 15 of at least one of the piezoelectric sensors 1;

a plurality of third signal lines 33 each connected to the drain electrode 16 of at least one of the piezoelectric sensors 1; and a controller (not shown in FIGS. 3 and 4) configured to load a signal to the plurality of first signal lines 31 and the plurality of second signal lines 32 and to receive a signal from the plurality of third signal lines 33.

The controller of this embodiment may load a first signal to the first signal line and control the turning on of the thin film transistor of the piezoelectric sensor. After turning on the thin film transistor, the controller loads a second signal to the second signal line, which is a test signal. When the piezoelectric layer of the piezoelectric sensor receives a pressure, electrical parameters of the second signal will be changed. The changed second signal is ultimately outputted by the third signal line as a third signal. The controller of the present embodiment obtains the third signal from the third signal line and compares the third signal and the second signal. If the difference between these two signals is greater than a certain standard, it may be determined that the pressure detecting device detects a change in the pressure.

Apparently, as can be seen from FIG. 3, the pressure detecting device of the present embodiment may include the piezoelectric sensors arranged in the form of an array so as to be applied to electronics of some special occasions.

Figure 5:
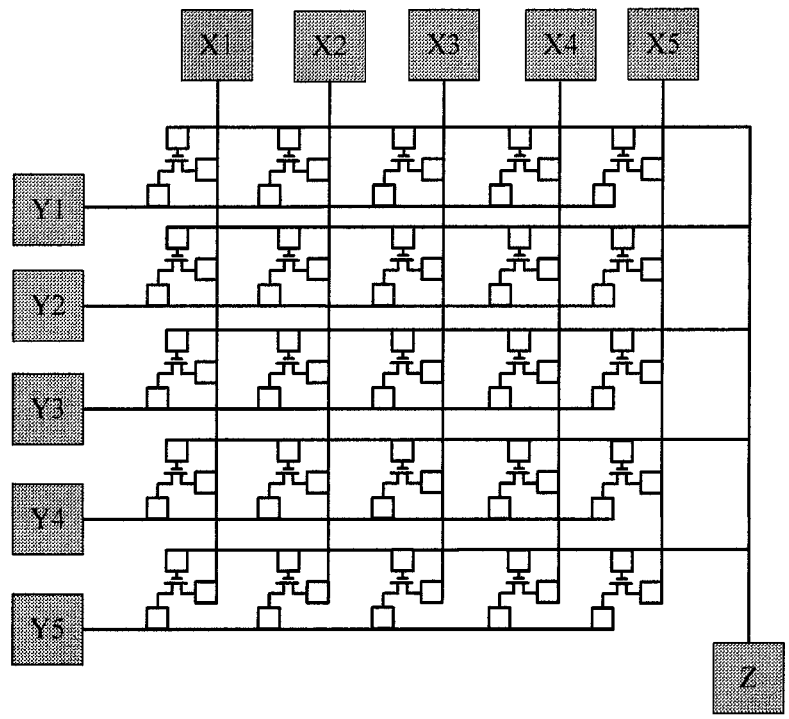
FIG. 5 is a schematic work diagram of the pressure detecting device provided in an embodiment of the present disclosure in an actual application.

In one embodiment, as shown in FIG. 5, it is assumed that the pressure detecting device of the present disclosure comprises piezoelectric sensors in the form of a 5×5 array. The drain electrodes of the piezoelectric sensors of each line are connected to one of the third signal lines, and are taken as a Y-axis in a coordinate system. Coordinate values Y1 to Y5 are assigned to the third signal lines connected with the drain electrodes in accordance with sequential numbers of the lines. Similarly, the source electrodes of the piezoelectric sensors of each column are connected to one of the second signal lines, and are taken as an X-axis in the coordinate system. Moreover, coordinate values X1 to X5 are assigned to the second signal lines connected with the source electrodes in accordance with sequential numbers of the columns. Finally, the gate electrodes of all the piezoelectric sensors are short circuited with a connection terminal Z of one of the first signal lines.

Thereafter, a first signal was loaded to the connection terminal Z through an internal program of the controller so that the thin film transistors of all the piezoelectric sensors to be detected in the array of FIG. 5 are in the state of turning on.

Assuming that there is a change in the pressure in the piezoelectric sensor with a coordinate of (X2, Y3), the controller may detect a change in the source-drain current of this piezoelectric sensor. And then, the pressure signal may be located based on the coordinate of the piezoelectric sensor where the source-drain current changes.

The above is the description of the pressure detecting device of the present embodiment. It shall be indicated that several improvements and modifications may be made by those having ordinary skills in the art without departing from the principle of the present disclosure. Such improvements and modifications shall be also regarded as falling within the protection scope of the present disclosure.

For example, the pressure detecting device of the present embodiment may be applied to a display screen. In this case, the corresponding first, second and third signal lines may be made of a transparent conductive material, such as ITO material, so as to avoid the occurrence of shielding light. Alternatively, the third signal lines of the present embodiment may also serve as pixel electrodes of the display device and controlled by a time division driving method. For example, the third signal lines may be formed into the shape of the pixel electrodes, and during the pressure detection phase, they are operated according to the principle of the present disclosure as described above, and during the display phase, the third signal lines are used to load a pixel electrode signal to drive the display of pictures.

In the above, the term "controller" may be implemented through one or more logic operation processing circuits. The logic operation processing circuit may be a processor that performs logic operation processing by executing program instructions. For example, the logic operation processing circuit may be a central processing unit (CPU), an application specific integrated circuit (ASIC), a digital signal processor (DSP), a field programmable gate array (FPGA), a single-chip microcomputer (MCU) or the like.

Figure 6:
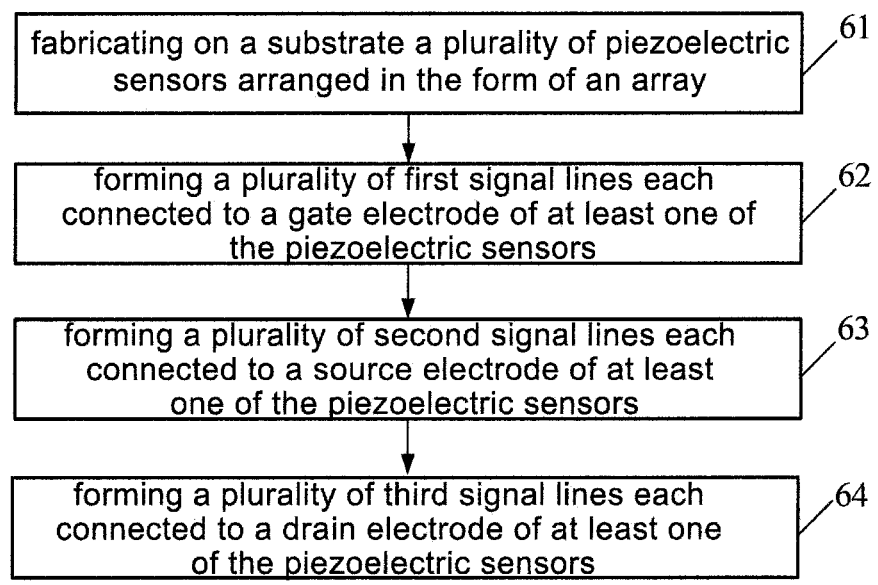
FIG. 6 is a schematic flow chart of a method for manufacturing a pressure detecting device provided in an embodiment of the present disclosure.

In a still another aspect, another embodiment of the present disclosure provides a method for manufacturing a pressure detecting device. As shown in FIG. 6, the method comprises the following steps:

step 61: fabricating on a substrate a plurality of piezoelectric sensors as described above, arranged in the form of an array;

step 62: forming a plurality of first signal lines each connected to a gate electrode of at least one of the piezoelectric sensors;

step 63: forming a plurality of second signal lines each connected to a source electrode of at least one of the piezoelectric sensors; and step 64: forming a plurality of third signal lines each connected to a drain electrode of at least one of the piezoelectric sensors.

As described above, the substrate may be a flexible substrate.

Obviously, the manufacturing method of this embodiment is used to manufacture the pressure detecting device as described above. Therefore, the technical effects that can be achieved by the pressure detecting device can be also achieved by the method of the present embodiment.

The method of the present embodiment will be described below in detail with reference to the specific embodiment.

In some embodiments, take a case where the method of the present embodiment adopts a bottom gate thin film transistor and a flexible substrate for example. The method for manufacturing the pressure detecting device comprises the following steps.

In step B1, a gate metal layer was formed on the flexible substrate, and a patterning process was performed on the gate metal layer so as to form a gate electrode of the thin film transistor.

Specifically, a sputtering or thermal evaporation method may be used to deposit the gate metal layer having a thickness of about 220 nm on the flexible substrate. The gate metal layer may be made of a metal, such as Cu, Al, Ag, Mo, Cr, Nd, Ni, Mn, Ti, Ta and W, or an alloy thereof. The gate metal layer may be a single-layered structure or a multi-layered structure that comprises, for example, Cu\Mo, Ti\Cu\Ti, Mo\Al\Mo, etc. A layer of photoresist was coated onto the gate metal layer, and then exposed using a mask plate such that the photoresist formed a photoresist unreserved region and a photoresist reserved region. The photoresist reserved region corresponds to a region where a pattern of the gate electrode is located, and the photoresist unreserved region corresponds to a region other than the pattern. After a developing treatment, the photoresist in the photoresist unreserved region was completely removed and the photoresist in the photoresist reserved region remained unchanged in its thickness. The gate metal film in the photoresist unreserved region was completely etched off through a wet etching process, and the remaining photoresist was peeled off to form the pattern of the gate electrode.

In step B2, a gate insulating layer was formed.

Specifically, a plasma enhanced chemical vapor deposition (PECVD) method may be used to deposit a gate insulating layer having a thickness of from 100 nm to 200 nm on the flexible substrate on which the step B1 had been carried out. The gate insulating layer may be made of oxides, nitrides or nitrogen oxides, and corresponding reaction gas may be $SiH_4$, $NH_3$, $N_2$ or $SiH_2Cl_2$, $NH_3$, $N_2$.

In step B3, a semiconductor nanomaterial layer was formed on the gate insulating layer, and a patterning process was performed on the semiconductor nanomaterial layer so as to form at least a part of the active layer of the thin film transistor.

Forming at least a part of the active layer of the thin film transistor may mean that the entire active layer is formed from the semiconductor nanomaterial or that the side of the active layer facing the piezoelectric layer is formed from the semiconductor nanomaterial.

Specifically, after applying the semiconductor nanomaterial to the surface of the gate insulating layer through a solution process such as spin-applying, dip-applying, etc., a pattern of the semiconductor nanomaterial was defined by photoetching. After development, oxygen reactive ion etching was performed using a photoresist mask to remove the semiconductor nanomaterial surrounding the mask, so as to form a pattern of the semiconductor nanomaterial layer. As can be known from the above, the pattern of the etched semiconductor nanomaterial layer is in contact with at least the channel region of the active layer.

In step B4, a source-drain metal layer was formed on the active layer, and a patterning process was performed on the source-drain metal layer to form a source-drain electrode layer comprising a source electrode and a drain electrode.

Specifically, magnetron sputtering, thermal evaporation or other film-forming methods may be used to deposit a source-drain metal layer having a thickness in the range of about 190 nm to 210 nm, which is preferably 200 nm, on the flexible substrate where the step B3 had been carried out. The source-drain metal layer may be made of a metal such as Cu, Al, Ag, Mo, Cr, Nd, Ni, Mn, Ti, Ta and W, or an alloy thereof. The source-drain metal layer may be a single layered structure or a multi-layered structure that comprises, for example, Cu\Mo, Ti\Cu\Ti, Mo\Al\Mo, etc. A layer of photoresist was coated onto the source-drain metal layer, and then exposed using a mask plate such that the photoresist formed a photoresist unreserved region and a photoresist reserved region. The photoresist reserved region corresponds to a region where patterns of the source and drain electrodes are located, and the photoresist unreserved region corresponds to a region other than the patterns. After a developing treatment, the photoresist in the photoresist unreserved region was completely removed and the photoresist in the photoresist reserved region remained unchanged in its thickness. The source-drain metal layer in the photoresist unreserved region was completely etched off through an etching process, and the remaining photoresist was peeled off to form the source-drain electrode layer comprising the drain and source electrodes.

In step B5, a PVDF solution was applied to the source-drain electrode layer to form, after annealing treatment, a PVDF polymer film that is in contact with the active layer and serves as the piezoelectric layer.

In step B6, a first via hole for exposing the gate electrode, a second via hole for exposing the source electrode and a third via hole for exposing the drain electrode were formed in the PVDF polymer film by a patterning process.

In step B7, a conductive material was deposited by a sputtering process to form a first signal line, a second signal line and a third signal line. The first signal line is connected to the gate electrode through the first via hole, the second signal line is connected to the source electrode through the second via hole, and the third signal line is connected to the drain electrode through the third via hole.

Specifically, this step may be carried out by depositing a ITO material having a thickness in the range of 130 nm to 140 nm, which is preferably 135 nm, in the via holes of the PVDE polymer film by a sputtering process, photoetching, developing and etching to form the patterns of the first, second and third signal lines.

In some embodiments, the method of this embodiment adopts a top gate thin film transistor for example. The method for manufacturing the pressure detecting device comprises the following steps.

In step B1', a semiconductor nanomaterial layer was formed on a substrate, and a patterning process was performed on the semiconductor nanomaterial layer so as to form at least a part of the active layer of the thin film transistor.

In step B2', a source-drain metal layer was formed on the active layer, and a patterning process was performed on the source-drain metal layer to form a source-drain electrode layer comprising a source electrode and a drain electrode.

In step B3', a PVDF solution was applied to the source-drain electrode layer to form, after annealing treatment, a PVDF polymer film that is in contact with the active layer and serves as the piezoelectric layer.

In step B4', a fourth via hole for exposing the source electrode and a fifth via hole for exposing the drain electrode were formed in the PVDF polymer film by a patterning process.

In step B5', a gate insulating layer was formed on the piezoelectric layer.

In step B6', a sixth via hole for exposing the source electrode and a seventh via hole for exposing the drain electrode were formed in the gate insulating layer by a patterning process. The sixth via hole and the fourth via hole form an eighth via hole for exposing the source electrode, and the fifth via hole and the seventh via hole form a ninth via hole for exposing the drain electrode.

In step B7', a gate metal layer was formed on the gate insulating layer and a patterning process was performed on the gate metal layer so as to form the gate electrode of the thin film transistor.

In step B8', a conductive material was deposited by a sputtering process to form a first signal line, a second signal line and a third signal line. The first signal line is connected to the gate electrode, the second signal line passes through the gate insulating layer and the piezoelectric layer through the eighth via hole to be connected to the source electrode, and the third signal line passes through the gate insulating layer and the piezoelectric layer through the ninth via hole to be connected to the drain electrode.

In the manufacturing process, for the specific process of each of the steps, reference may be made to the some embodiments above, and those processes will not be repeated here.

The above some embodiments are merely for illustrating the manufacturing methods of the present disclosure. It is contemplated for those skilled in the art that, in the methods of these embodiments, the structure and process of the prepared thin film transistor are not unique, thus resulting in that the number and positions of the via holes for achieving the connection between the subsequent signal lines and the electrodes may also vary. Although these differences might affect the specific process of the manufacturing method of the present disclosure, they follow the principle of the manufacturing method of the embodiments and thus fall within the scope of the present disclosure.

Figure 7:
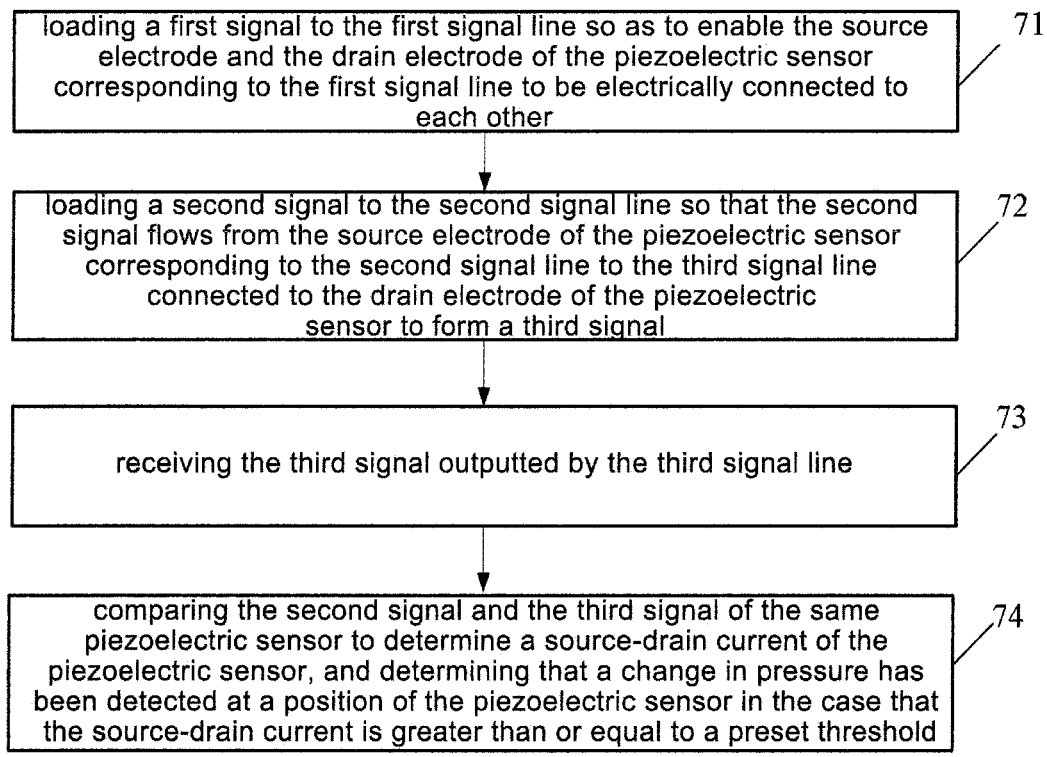
FIG. 7 is a schematic flowchart of a detection method provided in an embodiment of the present disclosure.

Furthermore, an embodiment of the present disclosure provides a detection method which is applied to the pressure detecting device provided above in the present disclosure. As shown in FIG. 7, the detection method comprises: step 71: loading a first signal to the first signal line so as to enable the source electrode and the drain electrode of the piezoelectric sensor corresponding to the first signal line to be electrically connected to each other;

step 72: loading a second signal to the second signal line so that the second signal flows from the source electrode of the piezoelectric sensor corresponding to the second signal line to the third signal line connected to the drain electrode of the piezoelectric sensor to form a third signal;

step 73: receiving the third signal outputted by the third signal line; and step 74: comparing the second signal and the third signal of the same piezoelectric sensor to determine a source-drain current of the piezoelectric sensor, and determining that a change in pressure has been detected at a position of the piezoelectric sensor in the case that the source-drain current is greater than or equal to a preset threshold.

Obviously, the detection method provided in the present disclosure adopts the pressure detecting device provided above in the present disclosure. The technical effects that can be achieved by the pressure detecting device can be also achieved by the detection method of this embodiment.

Unless otherwise defined, any technical or scientific term used herein shall have the common meaning understood by a person having ordinary skills. The use of the word "comprising" and the like in this disclosure means that an element or item preceding the word encompasses the element or item appearing after the word and equivalents thereof, and no other element or item is excluded. Such words as "arrange" or the like are not limited to physical or mechanical connections, but may be indirect connection. Such words as "on", "under", "left" and "right" are merely used to represent relative position relationship, and when an absolute position of the object is changed, the relative position relationship will be changed too. It will be understood that when an element such as a layer, film, region, or substrate is referred to as being "on" or "under" another element, it can be "directly on" or "under" the other element, or one or more intervening elements may be present.

The above are optional embodiments of the present disclosure. It shall be indicated that several improvements and modifications can be made by a person skilled in the art without departing from the principle of the present disclosure, and such improvements and modifications shall be also regarded as falling within the protection scope of the present disclosure.

What is claimed is:

1. A piezoelectric sensor, comprising:
   a substrate;
   a thin film transistor located on the substrate and comprising an active layer, a source electrode and a drain electrode; and
   a piezoelectric layer that is in contact with the active layer of the thin film transistor,
   wherein the piezoelectric layer is provided on the source electrode and the drain electrode, and in direct contact with the source electrode and the drain electrode.

2. The piezoelectric sensor according to claim 1, wherein the piezoelectric layer is in contact with at least a channel region of the active layer between a source electrode and a drain electrode of the thin film transistor.

3. The piezoelectric sensor according to claim 1, wherein at least a side of the active layer, which is in contact with the piezoelectric layer, is formed from a semiconductor nanomaterial.

4. The piezoelectric sensor according to claim 1, wherein the active layer is formed from a semiconductor nanomaterial.

5. The piezoelectric sensor according to claim 3, wherein the semiconductor nanomaterial comprises at least one selected from the group consisting of $MoS_2$, semiconducting carbon nanotubes, silicon nanowires and group III-V nanowires.

6. The piezoelectric sensor according to claim 4, wherein the semiconductor nanomaterial comprises at least one selected from the group consisting of $MoS_2$, semiconducting carbon nanotubes, silicon nanowires and group III-V nanowires.

7. The piezoelectric sensor according to claim 1, wherein the material for forming the piezoelectric layer comprises polyvinylidene fluoride (PVDF).

8. The piezoelectric sensor according to claim 1, wherein the substrate is a flexible substrate.

9. A method for manufacturing a piezoelectric sensor, comprising:
   providing a substrate;
   preparing, on the substrate, a thin film transistor comprising an active layer, a source electrode and a drain electrode; and
   forming a piezoelectric layer that is in contact with the active layer of the thin film transistor,
   wherein the piezoelectric layer is provided on the source electrode and the drain electrode, and in direct contact with the source electrode and the drain electrode.

10. The method according to claim 9, wherein the step of preparing a thin film transistor on the substrate comprises:
    forming a gate metal layer on the substrate and performing a patterning process on the gate metal layer so as to form a gate electrode of the thin film transistor;
    forming a gate insulating layer;
    forming a semiconductor nanomaterial layer on the gate insulating layer and performing a patterning process on the semiconductor nanomaterial layer so as to form at least a part of the active layer of the thin film transistor; and
    forming a source-drain metal layer on the active layer and performing a patterning process on the source-drain metal layer so as to form a source-drain electrode layer comprising a source electrode and a drain electrode, and
    the step of forming a piezoelectric layer that is in contact with the active layer of the thin film transistor comprises:
    applying a polyvinylidene fluoride (PVDF) solution to the source-drain electrode layer to form, after annealing treatment, a PVDF polymer film that is in contact with the active layer and serves as the piezoelectric layer.

11. The method according to claim 9, wherein the steps of preparing a thin film transistor on the substrate and forming a piezoelectric layer that is in contact with the active layer of the thin film transistor comprises:
    forming a semiconductor nanomaterial layer on the substrate and performing a patterning process on the semiconductor nanomaterial layer so as to form at least a part of the active layer of the thin film transistor;
    forming a source-drain metal layer on the active layer and performing a patterning process on the source-drain metal layer so as to form a source-drain electrode layer comprising a source electrode and a drain electrode; and
    applying a polyvinylidene fluoride (PVDF) solution to the source-drain electrode layer to form, after annealing treatment, a PVDF polymer film that is in contact with the active layer and serves as the piezoelectric layer;
    forming a gate insulating layer on the piezoelectric layer; and
    forming a gate metal layer on the gate insulating layer and performing a patterning process on the gate metal layer so as to form a gate electrode of the thin film transistor.

12. A pressure detecting device, comprising:
    a plurality of piezoelectric sensors according to claim 1 arranged in the form of an array;
    a plurality of first signal lines each connected to a gate electrode of at least one of the piezoelectric sensors;
    a plurality of second signal lines each connected to a source electrode of at least one of the piezoelectric sensors;
    a plurality of third signal lines each connected to a drain electrode of at least one of the piezoelectric sensors; and a controller configured to load a signal to the plurality of first signal lines and the plurality of second signal lines and to receive a signal from the plurality of third signal lines.

13. The device according to claim 12, wherein the piezoelectric layer is in contact with at least a channel region of the active layer between the source electrode and the drain electrode of the thin film transistor.

14. The device according to claim 12, wherein the active layer is formed from a semiconductor nanomaterial.

15. A method for manufacturing a pressure detecting device, comprising:
    fabricating on a substrate a plurality of piezoelectric sensors according to claim 1 arranged in the form of an array;
    forming a plurality of first signal lines each connected to a gate electrode of at least one of the piezoelectric sensors;
    forming a plurality of second signal lines each connected to a source electrode of at least one of the piezoelectric sensors; and
    forming a plurality of third signal lines each connected to a drain electrode of at least one of the piezoelectric sensors.

16. The method according to claim 15, wherein the step of fabricating on a substrate a plurality of piezoelectric sensors in the form of an array comprises:
    forming a gate metal layer on the substrate and performing a patterning process on the gate metal layer so as to form the gate electrode of the thin film transistor;
    forming a gate insulating layer;
    forming a semiconductor nanomaterial layer on the gate insulating layer and performing a patterning process on the semiconductor nanomaterial layer so as to form at least a part of the active layer of the thin film transistor;
    forming a source-drain metal layer on the active layer and performing a patterning process on the source-drain metal layer so as to form a source-drain electrode layer comprising the source electrode and the drain electrode;
    applying a polyvinylidene fluoride (PVDF) solution to the source-drain electrode layer to form, after annealing treatment, a PVDF polymer film that is in contact with the active layer and serves as the piezoelectric layer; and
    forming a first via hole for exposing the gate electrode, a second via hole for exposing the source electrode and a third via hole for exposing the drain electrode in the PVDF polymer film by a patterning process, and
    the step of forming a plurality of first signal lines, a plurality of second signal lines and a plurality of third signal lines comprises:
    depositing a conductive material by a sputtering process to form a first signal line, a second signal line and a third signal line, wherein the first signal line is connected to the gate electrode through the first via hole, the second signal line is connected to the source electrode through the second via hole, and the third signal line is connected to the drain electrode through the third via hole.

17. The method according to claim 16, wherein the semiconductor nanomaterial comprises at least one selected from the group consisting of $MoS_2$, semiconducting carbon nanotubes, silicon nanowires and group III-V nanowires.

18. The method according to claim 15, wherein the step of fabricating on a substrate a plurality of piezoelectric sensors in the form of an array comprises:
    forming a semiconductor nanomaterial layer on the substrate and performing a patterning process on the semiconductor nanomaterial layer so as to form at least a part of the active layer of the thin film transistor;
    forming a source-drain metal layer on the active layer and performing a patterning process on the source-drain metal layer so as to form a source-drain electrode layer comprising the source electrode and the drain electrode;
    applying a polyvinylidene fluoride (PVDF) solution to the source-drain electrode layer to form, after annealing treatment, a PVDF polymer film that is in contact with the active layer and serves as the piezoelectric layer;
    forming a fourth via hole for exposing the source electrode and a fifth via hole for exposing the drain electrode in the PVDF polymer film by a patterning process;
    forming a gate insulating layer on the piezoelectric layer;
    forming a sixth via hole for exposing the source electrode and a seventh via hole for exposing the drain electrode in the gate insulating layer by a patterning process, the sixth via hole and the fourth via hole forming an eighth via hole for exposing the source electrode, the fifth via hole and the seventh via hole forming a ninth via hole for exposing the drain electrode; and
    forming a gate metal layer on the gate insulating layer and performing a patterning process on the gate metal layer so as to form the gate electrode of the thin film transistor, and
    the step of forming a plurality of first signal lines, a plurality of second signal lines and a plurality of third signal lines comprises:
    depositing a conductive material by a sputtering process to form a first signal line, a second signal line and a third signal line, wherein the first signal line is connected to the gate electrode, the second signal line is connected to the source electrode through the eighth via hole, and the third signal line is connected to the drain electrode through the ninth via hole.

19. The method according to claim 18, wherein the semiconductor nanomaterial comprises at least one of $MoS_2$, semiconducting carbon nanotubes, silicon nanowires and group III-V nanowires.

20. A pressure detecting method which is applied to the pressure detecting device according to claim 12, the method comprising:
    loading a first signal to the first signal line so as to enable the source electrode and the drain electrode of the piezoelectric sensor corresponding to the first signal line to be electrically connected to each other;
    loading a second signal to the second signal line so that the second signal flows from the source electrode of the piezoelectric sensor corresponding to the second signal line to the third signal line connected to the drain electrode of the piezoelectric sensor to form a third signal;
    receiving the third signal outputted by the third signal line; and
    comparing the second signal and the third signal of the same piezoelectric sensor to determine a source-drain current of the piezoelectric sensor, and determining that a change in pressure has been detected at a position of the piezoelectric sensor in the case that the source-drain current is greater than or equal to a preset threshold.

* * * * *